US007945045B2

(12) United States Patent
Kim et al.

(10) Patent No.: US 7,945,045 B2
(45) Date of Patent: May 17, 2011

(54) DEVICE AND METHOD FOR GENERATING CHAOTIC SIGNAL

(75) Inventors: Yu Sin Kim, Daejeon (KR); No Chul Myung, Daejeon (KR); Jeong Ho Moon, Daejeon (KR); Moo Il Jeong, Daejeon (KR); Chang Seok Lee, Daejeon (KR); Chang Soo Yang, Seongnam (KR); Kwang Du Lee, Damyang (KR); Sang Gyu Park, Suwon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 949 days.

(21) Appl. No.: 11/889,326

(22) Filed: Aug. 10, 2007

(65) Prior Publication Data
US 2008/0069349 A1  Mar. 20, 2008

(30) Foreign Application Priority Data

Aug. 14, 2006 (KR) .................. 10-2006-0076593

(51) Int. Cl.
*H04L 9/00* (2006.01)
(52) U.S. Cl. ....................................... 380/46
(58) Field of Classification Search .................. None
See application file for complete search history.

(56) References Cited

U.S. PATENT DOCUMENTS

| 6,088,291 A * | 7/2000 | Fujioka et al. ........... 365/233.14 |
| 2004/0017840 A1 * | 1/2004 | Siwiak ........................... 375/146 |
| 2004/0174928 A1 * | 9/2004 | Siwiak et al. ................. 375/146 |
| 2005/0240744 A1 * | 10/2005 | Shaikh et al. ................. 711/167 |

FOREIGN PATENT DOCUMENTS

| EP | 1 463 199 A1 | 9/2004 |
| JP | 10-214177 | 8/1998 |
| JP | 2000-194537 | 7/2000 |
| JP | 2000-310942 | 11/2000 |
| KR | 10-2004-0110964 | 12/2004 |
| KR | 10-2006-0035375 | 4/2006 |

* cited by examiner

*Primary Examiner* — Jung Kim
*Assistant Examiner* — Shaun Gregory

(57) ABSTRACT

Provided is a device for generating a chaotic signal comprising a PN signal generator that is composed of a digital logic circuit and generates a digital pseudo random signal with a predetermined frequency; a voltage control that generates a clock signal with a predetermined frequency; a mixer that mixes the pseudo random signal and the clock signal so as to generate a chaotic signal to output; and a band-pass filter that filters the chaotic signal, output from the mixer, into a chaotic signal of a desired band and then outputs the filtered signal.

10 Claims, 13 Drawing Sheets

[FIG. 1]
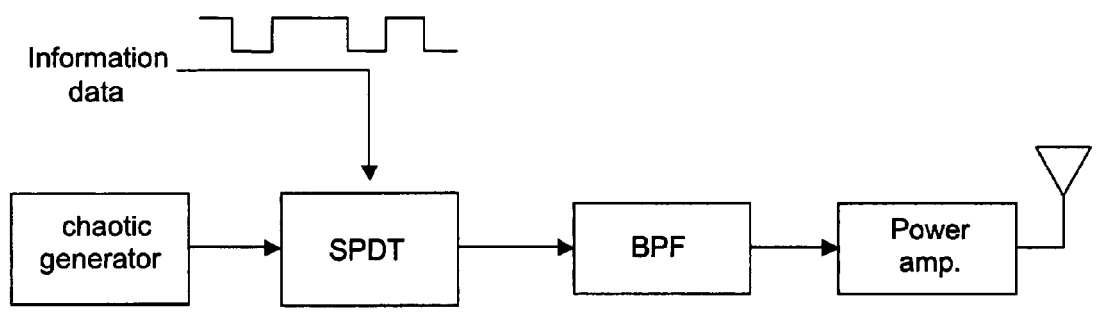
[FIG. 2]
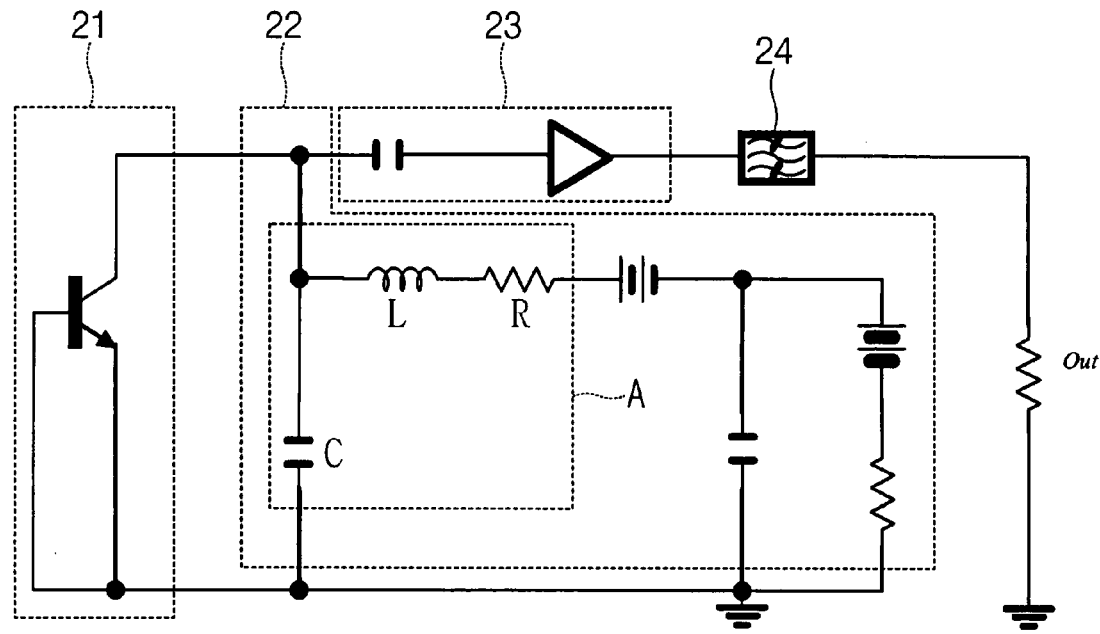

[FIG. 3]
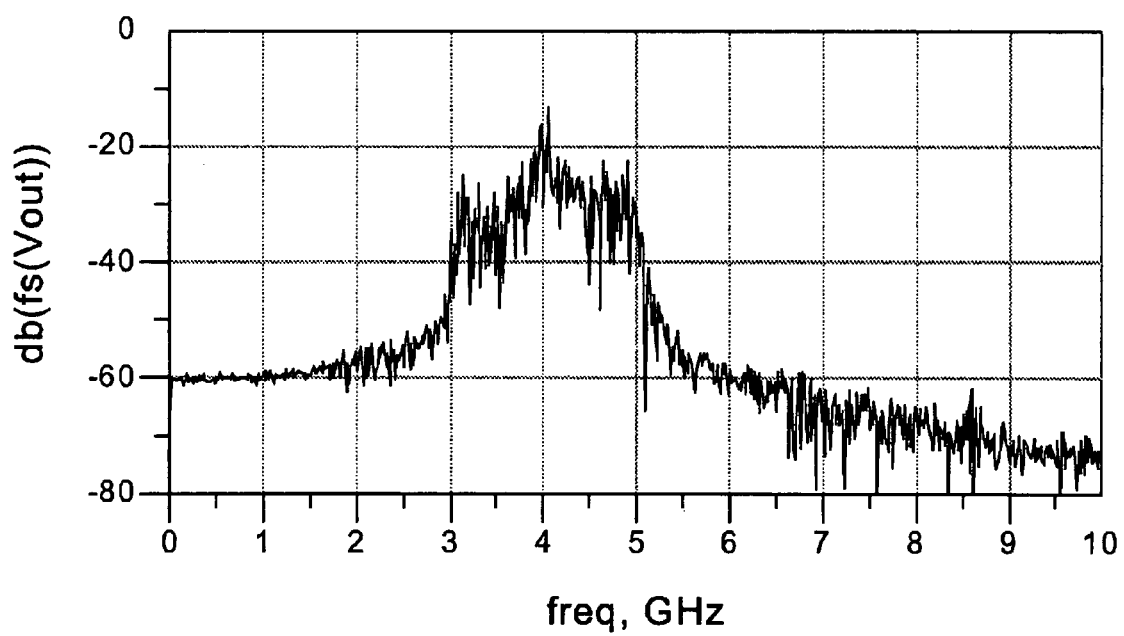

[FIG. 4A]
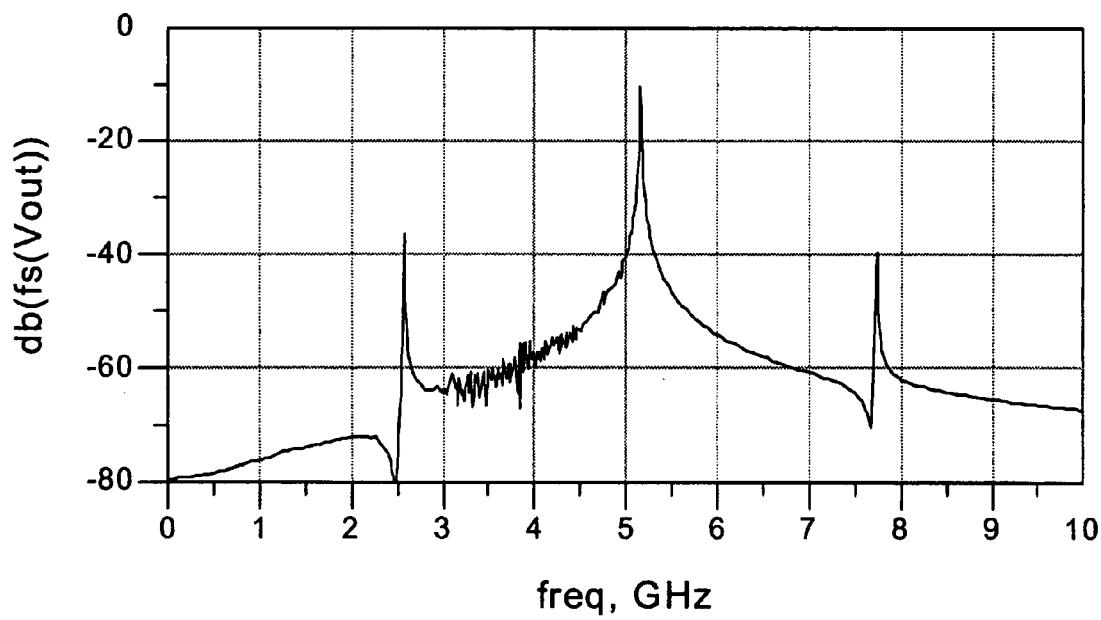
[FIG. 4B]
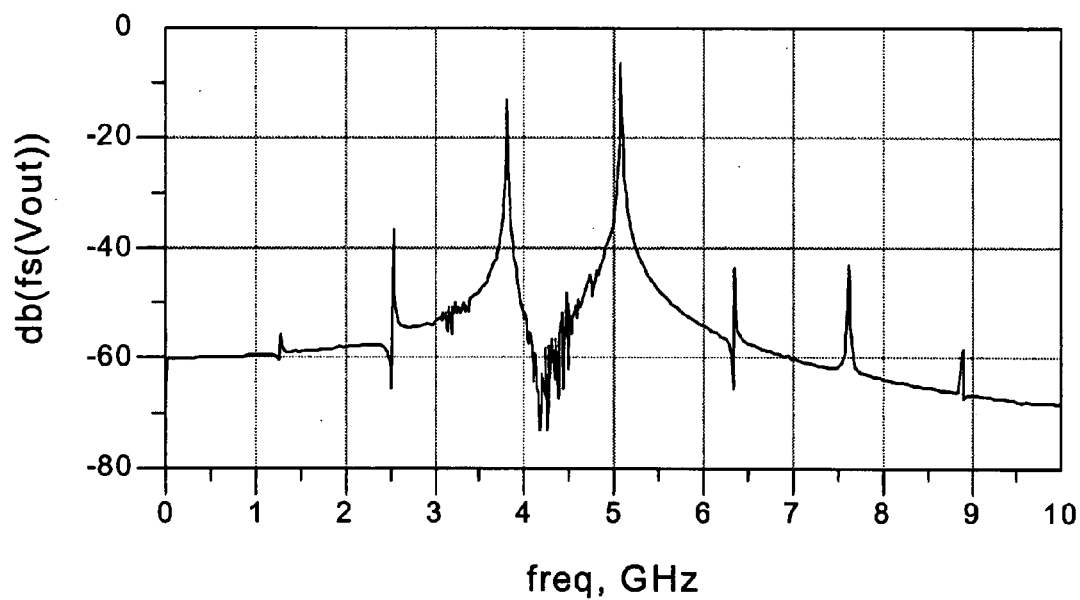

[FIG. 4C]
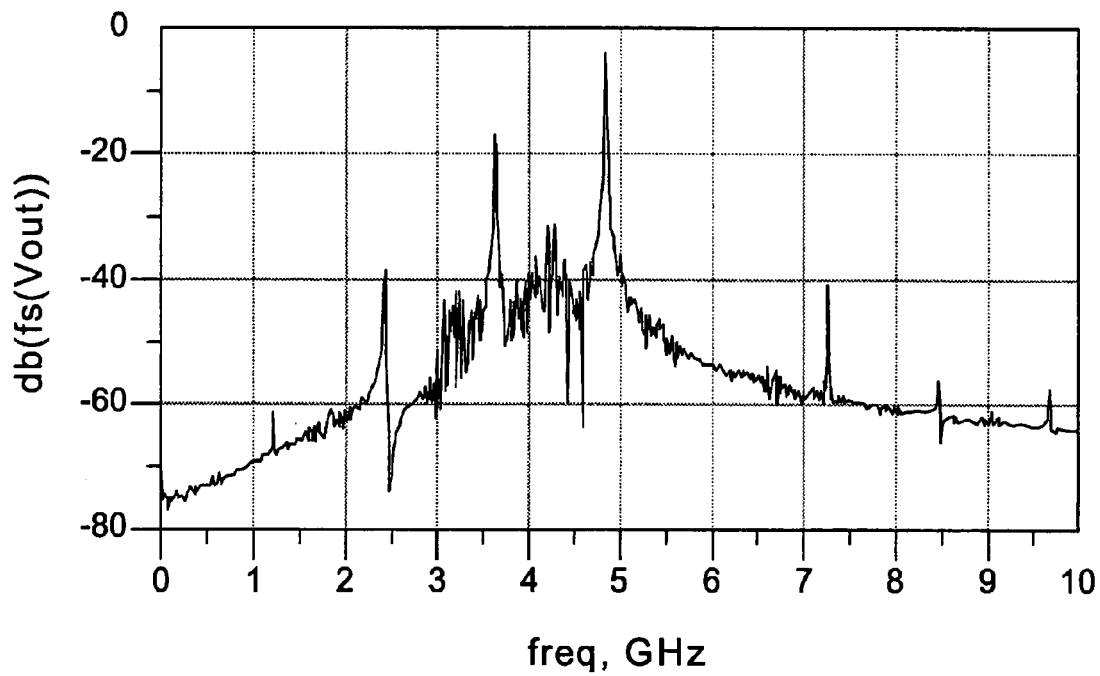
[FIG. 5]
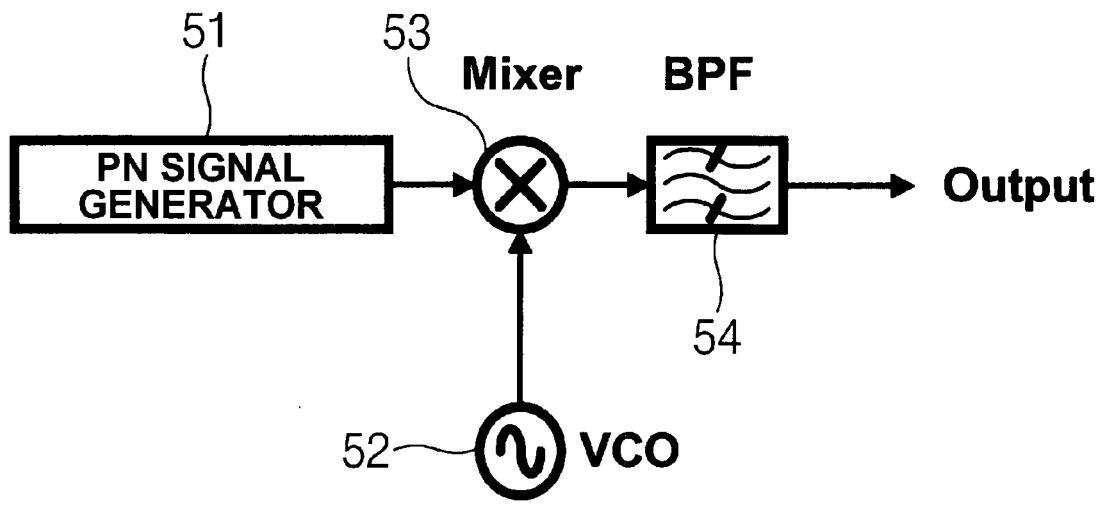

[FIG. 6]
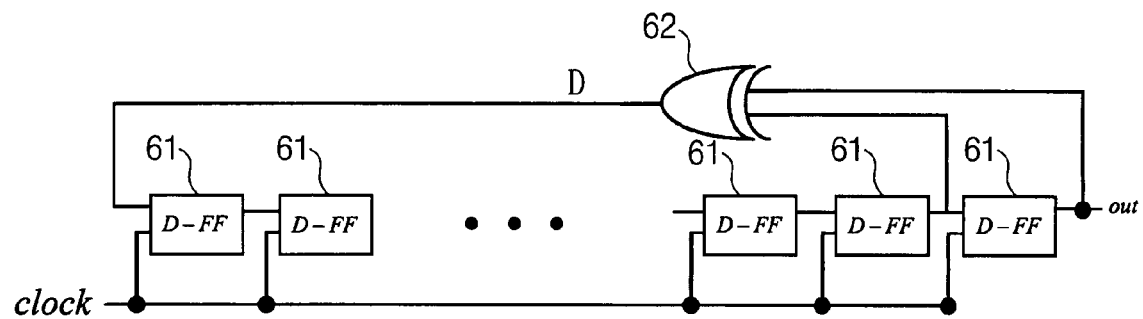
[FIG. 7A]
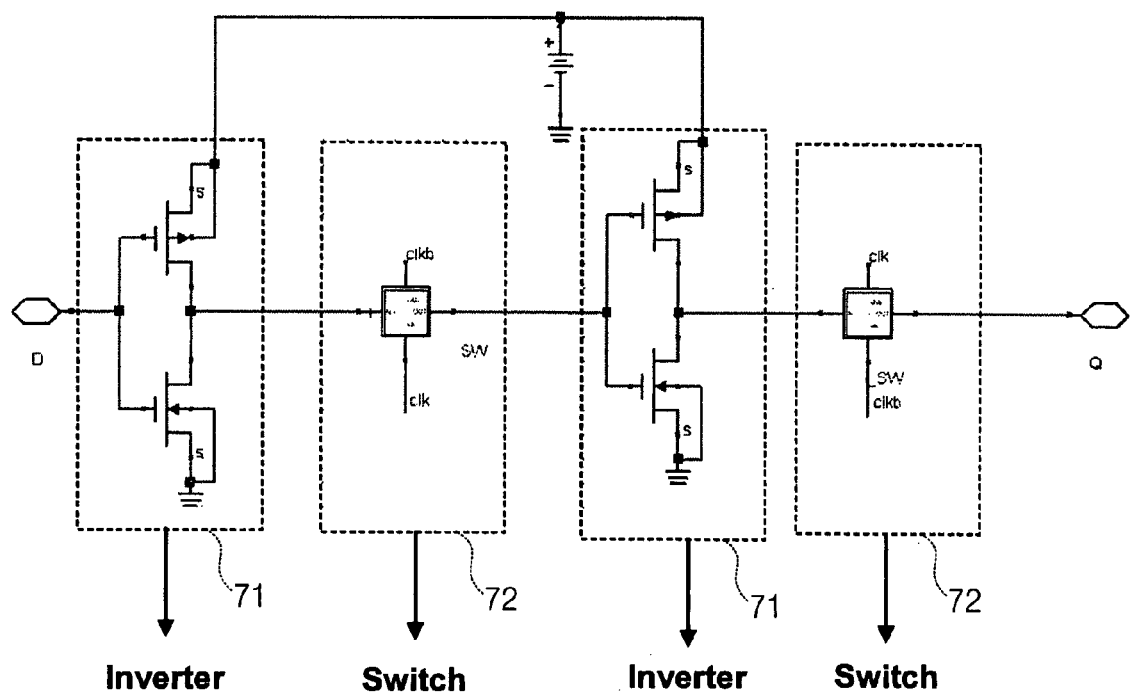

[FIG. 7B]
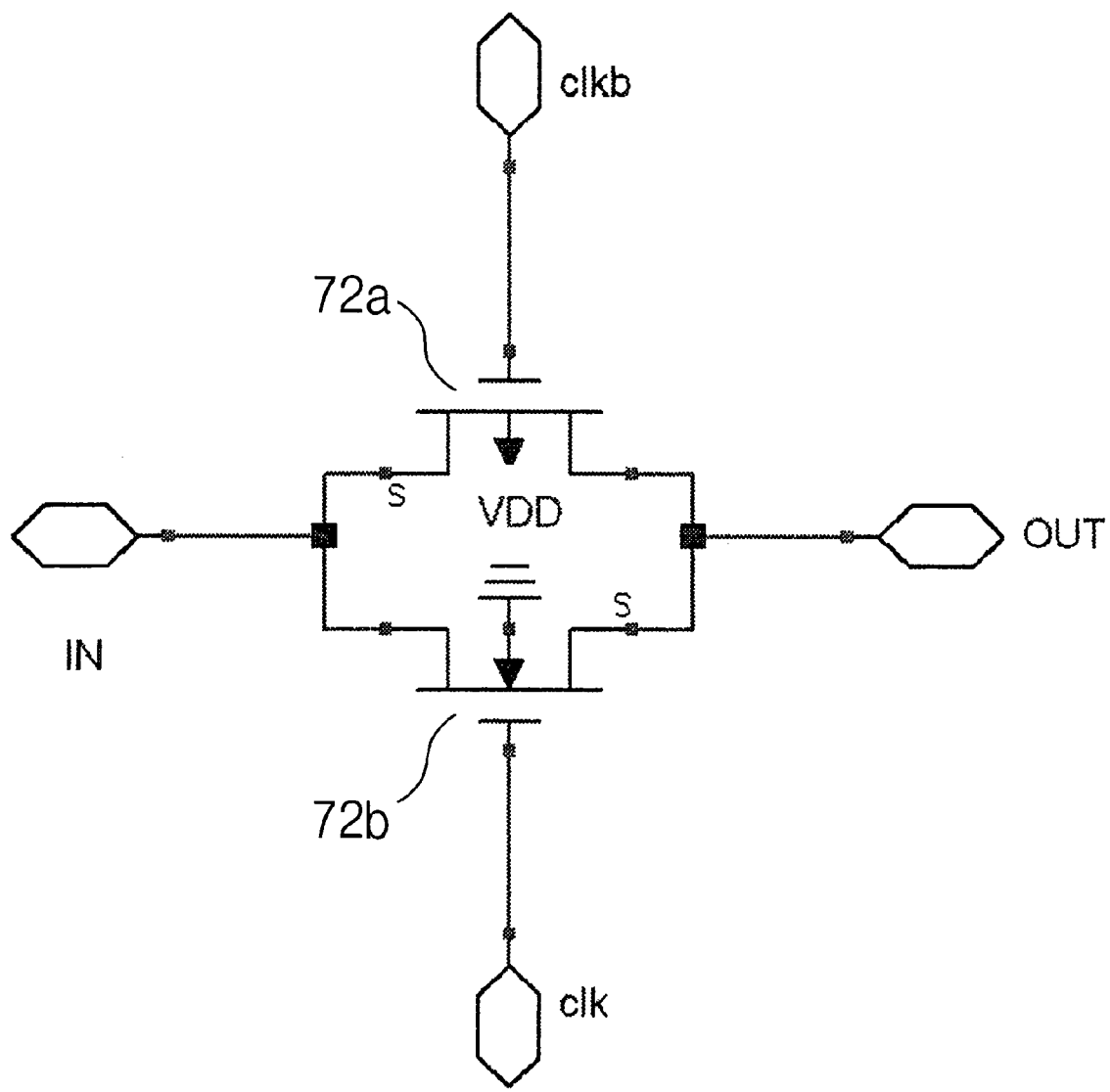

[FIG. 7C]
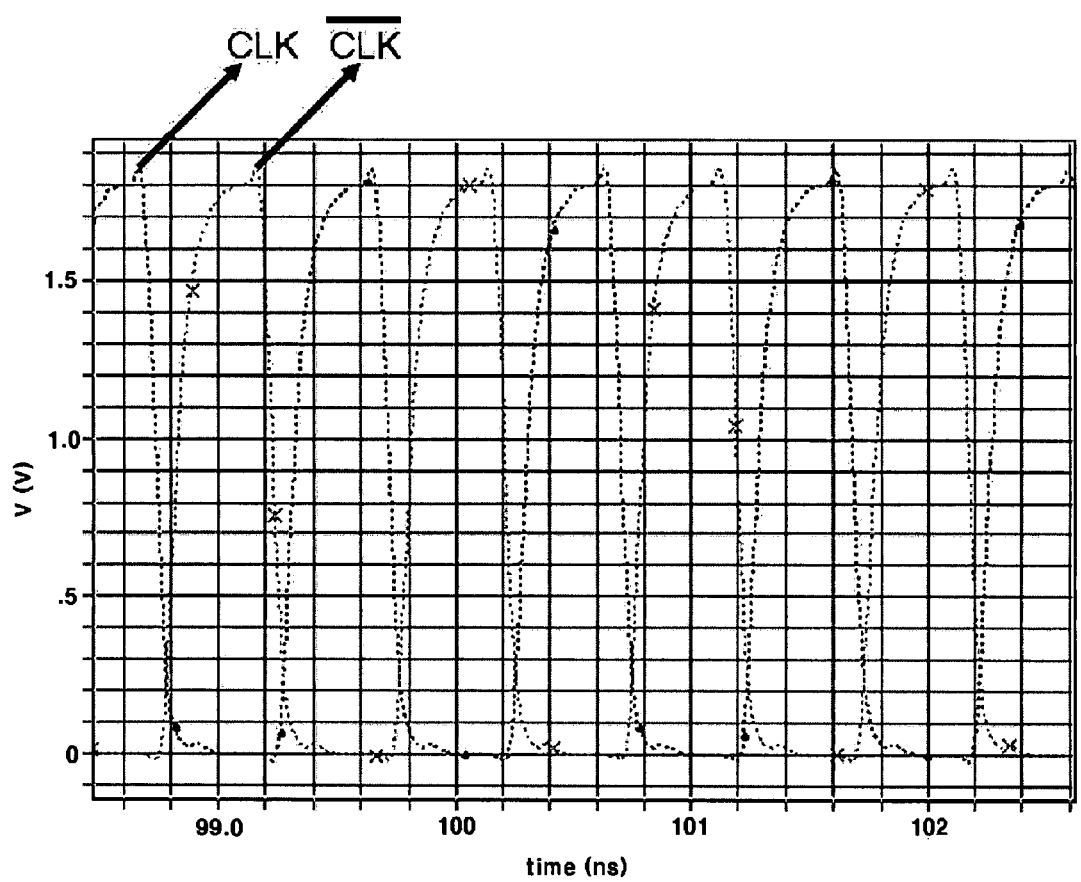

[FIG. 8]
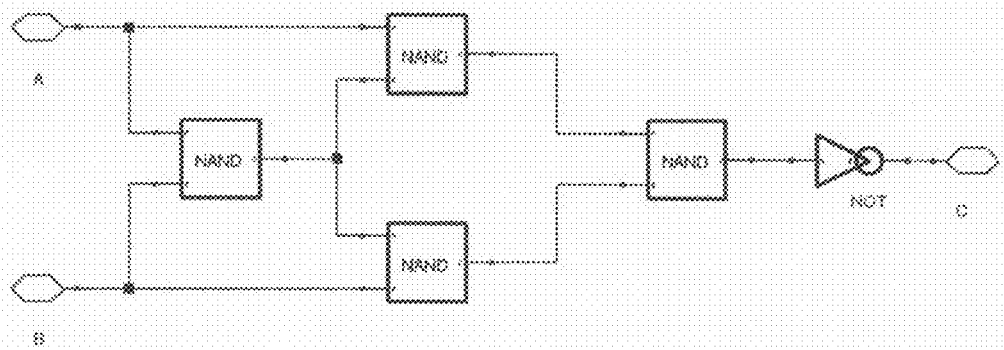
[FIG. 9A]
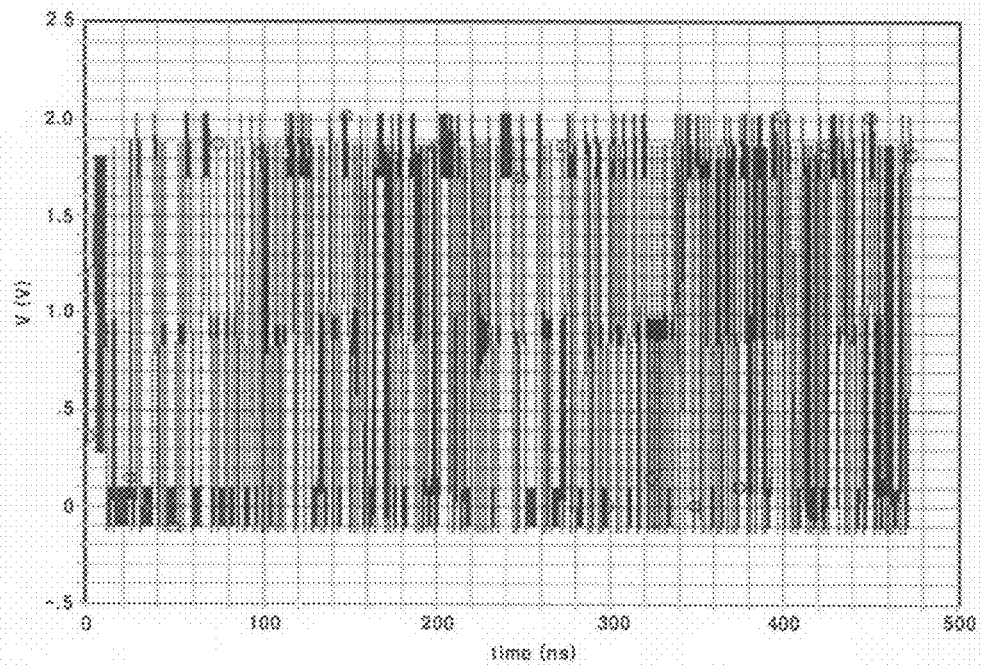

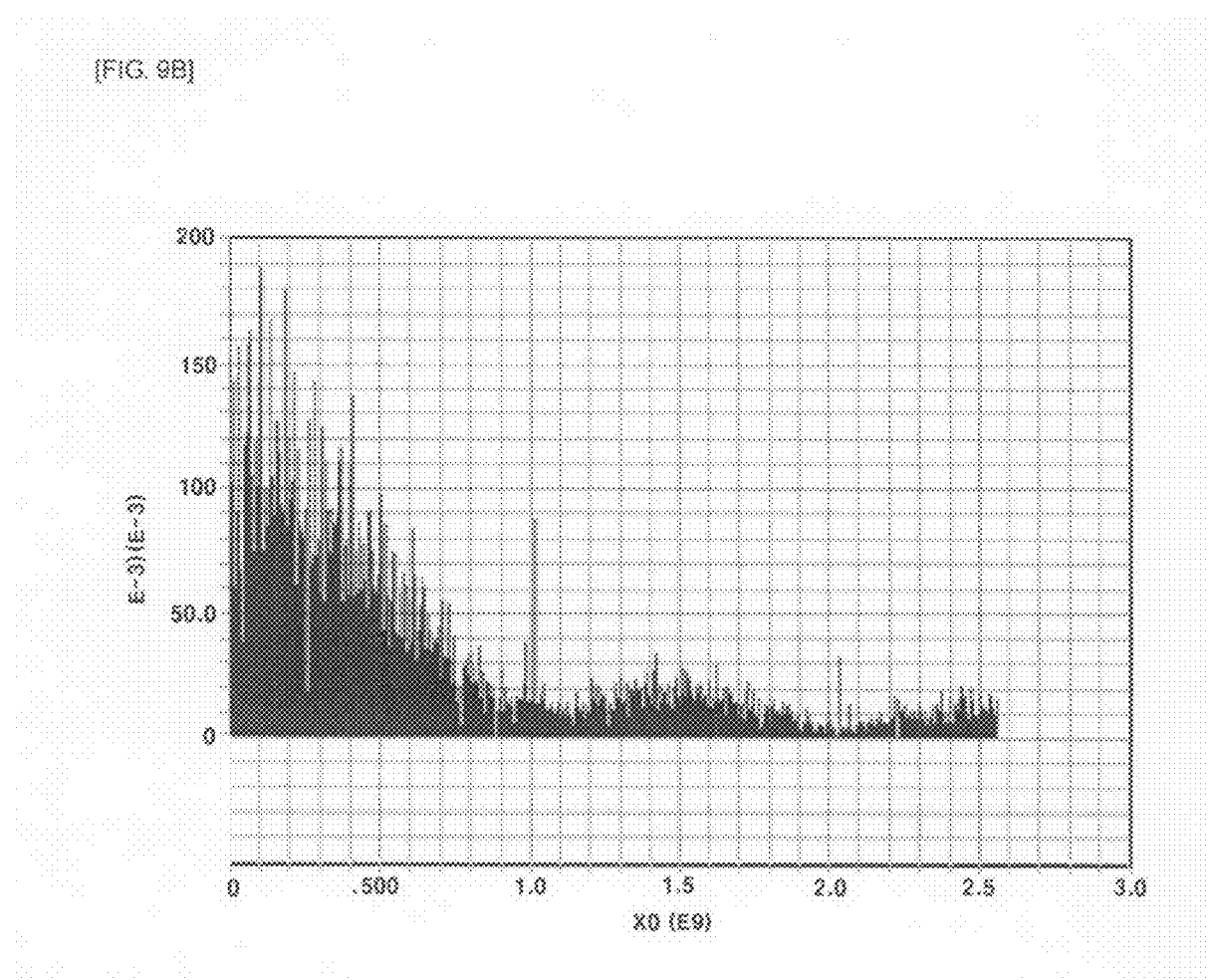

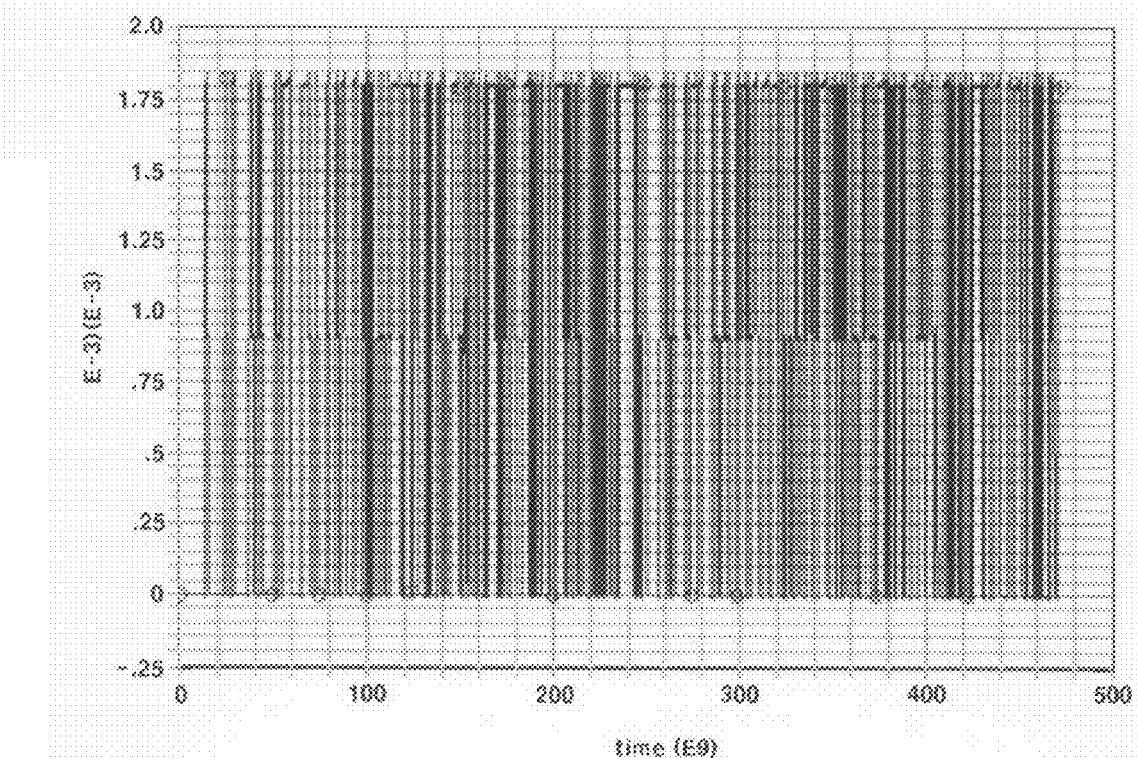

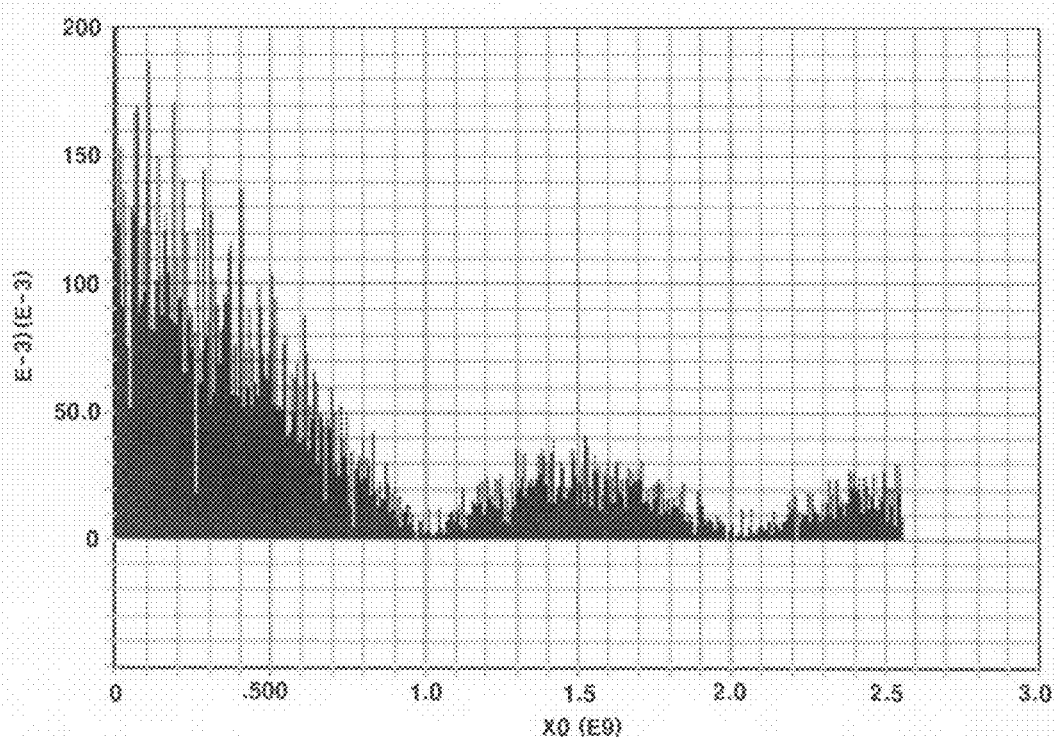

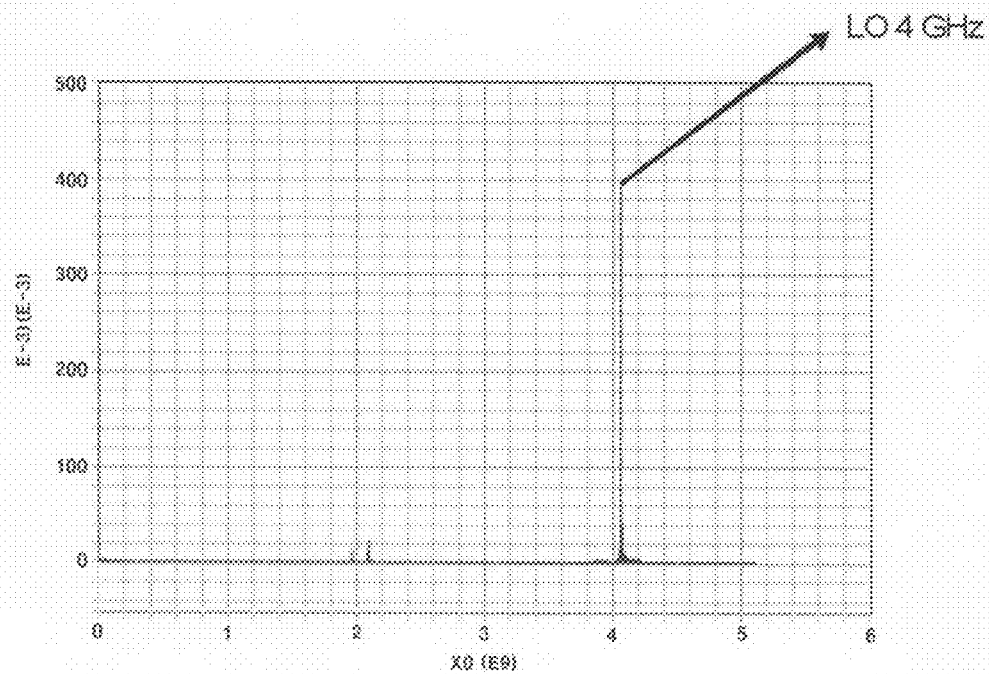
[FIG. 9E]
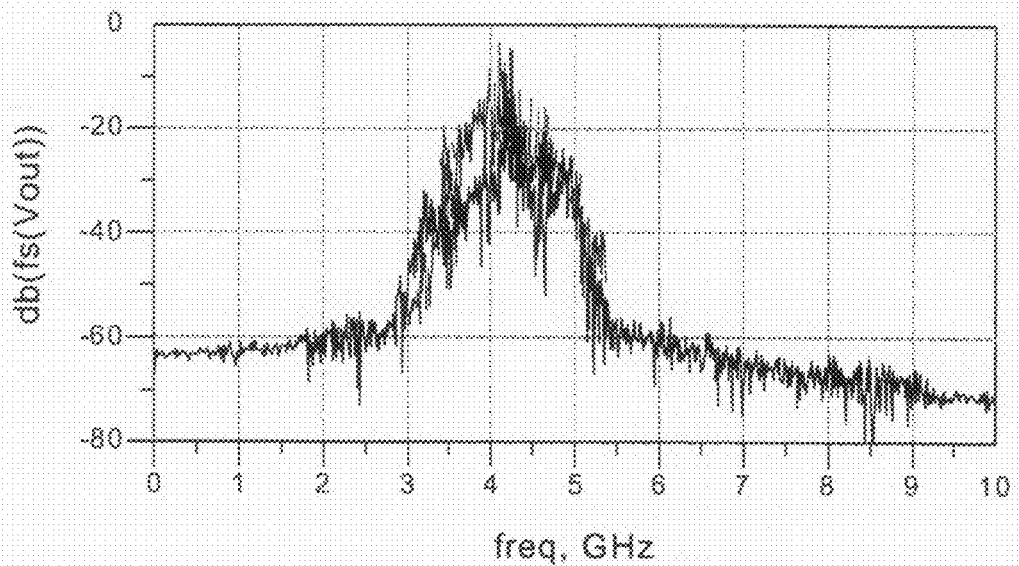
[FIG. 9F]

[FIG. 10]
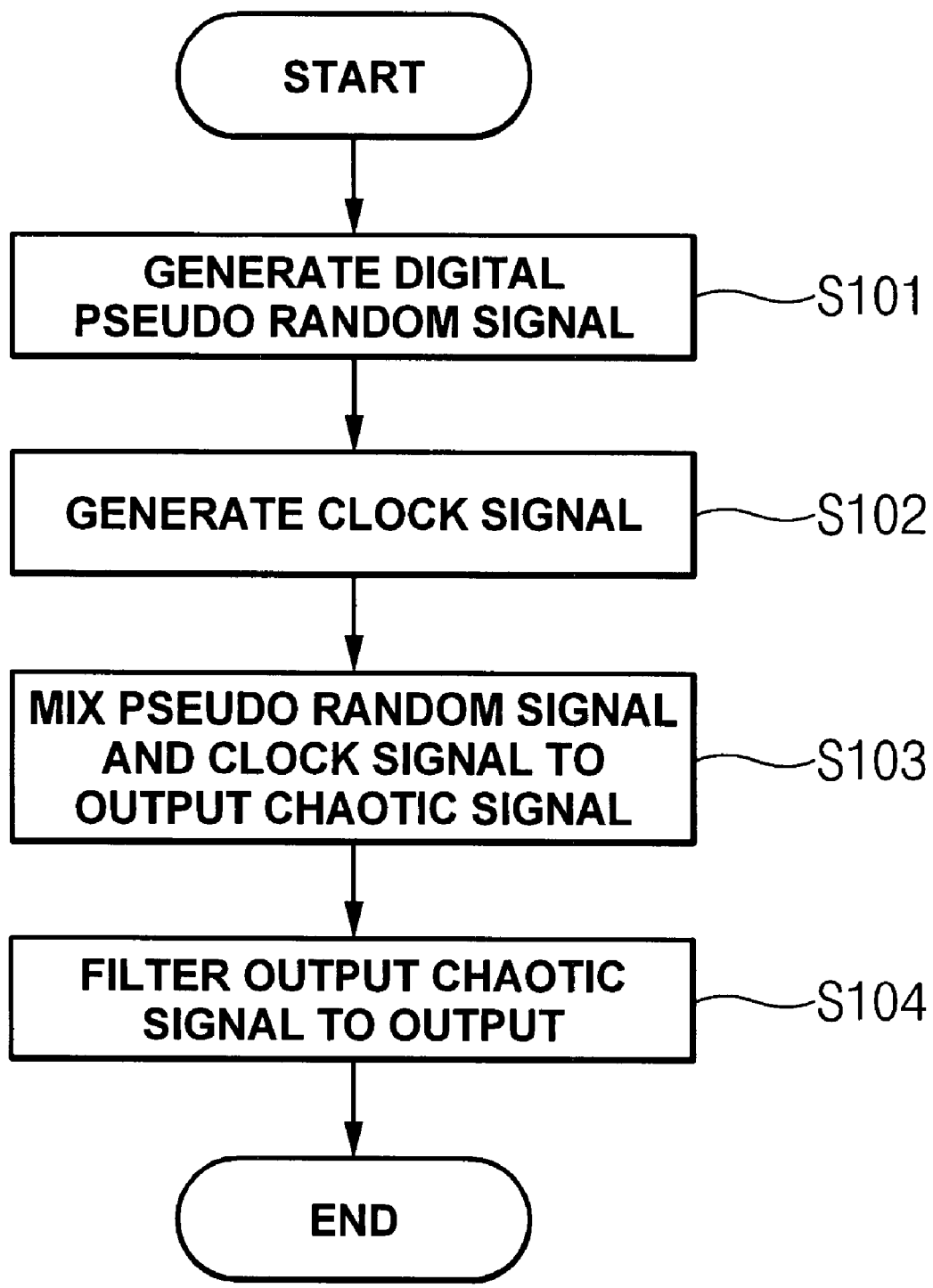

DEVICE AND METHOD FOR GENERATING CHAOTIC SIGNAL

CROSS-REFERENCE TO RELATED APPLICATIONS

This application claims the benefit of Korean Patent Application No. 10-2006-0076593 filed with the Korea Intellectual Property Office on Aug. 14, 2006, the disclosure of which is incorporated herein by reference.

BACKGROUND OF THE INVENTION

1. Field of the Invention

The present invention relates to a device and a method for generating a chaotic signal, which are applied to Ultra Wide Band (hereinafter, referred to as 'UWB') communication using an On-Off Keying (OOK) scheme. In the device and the method, a digital-type PN signal generator is used to stably generate a chaotic signal regardless of a process change.

2. Description of the Related Art

In general, the UWB is referred to as a frequency band where a frequency bandwidth occupies more than 25% of a center frequency or is more than 500 MHz.

When the UWB is observed at a time axis, it can be found that the UWB has a very small signal width. Therefore, the UWB can prevent spreading or superposition of signals, caused by multiple propagation paths, and has a strong characteristic with respect to noise interference. Accordingly, the UWB is widely used in location-awareness communication where high-speed communication and precise distance calculation are required.

As for systems which are widely researched as a communication system using the UWB, there is provided a chaos communication system. The chaos communication system uses a chaotic signal having a noise characteristic.

Typically, a square-wave signal has a regular phase in accordance with time. Therefore, when an interference signal with an antiphase is added, the signal can be distorted or offset. However, since a chaotic signal has an aperiodic characteristic like noise, the chaotic signal does not have a clear phase. Accordingly, although an antiphase signal or an approximate interference signal is added, interference does not occur.

Further, since the chaotic signal has an aperiodic characteristic as described above, the chaotic signal has a constant magnitude in a wideband range regardless of a period, when it is analyzed on a frequency axis, which means that the chaotic signal has high energy efficiency.

In addition, the chaos communication system uses an On-Off Keying (OOK) scheme in which a chaotic signal within a microwave band is directly modulated using continuous packet information signals of a modem.

FIG. 1 is a block diagram showing a basic structure of an OOK modulator using a chaotic signal. As shown in FIG. 1, a general OOK modulation scheme is where a chaotic signal is generated to apply a pulse to a Single Pole Double Throw (SPDT) switch. In the OOK modulation scheme, information to be transmitted is divided into information in which a pulse is present ('1') and information in which a pulse is not present ('0'). Further, reception is divided into "1" and "0", depending on the presence or absence of energy.

As such, the chaos communication system using the OOK scheme, which is a direct modulation scheme, has a few spikes. Therefore, coding such as time hopping or the like is not needed separately in a modem, and circuits such as a phase looked loop (PLL), a mixer, and the like for intermediate-frequency conversion are not needed, which makes it possible to simply implement a transmitting and receiving device.

FIG. 2 is a circuit diagram of a conventional device for generating a chaotic signal. As shown in FIG. 2, the conventional device for generating a chaotic signal includes an oscillator 21, a wideband chaotic signal generator 22, an amplifier 23, and a band-pass filter 24.

In the circuit of FIG. 2, the wideband chaotic signal generator 22 generates a wideband chaotic signal by using a signal generated from the oscillator 21. The amplifier 23 amplifies the generated chaotic signal, and the band-pass filter 24 extracts only a UWB signal in the range of 3.1 to 5.15 GHz.

FIG. 3 is a graph showing a simulation result of FIG. 2, in which a voltage waveform at an output node is converted into a frequency spectrum.

As shown in FIG. 3, it can be found that the conventional device for generating a chaotic signal generates a chaotic signal in the range of 3.1 to 5.5 GHz which corresponds to the UWB.

However, the conventional device for generating a chaotic signal shown in FIG. 2 is sensitive to the value of the passive element A used for generating a chaotic signal and parasitic components existing in a collector and an emitter of the transistor used as the oscillator 21. Therefore, the device has difficulties in generating a stable chaotic signal.

That is, when the value of the passive element A shown in FIG. 2 changes to some degree in accordance with a process change, a chaotic signal may not be generated. FIGS. 4A to 4C are graph for explaining this, showing simulation results when the value of the passive element shown in FIG. 2 changes in accordance with a process change.

FIG. 4A shows a simulation result when a resistor R of the passive element A shown in FIG. 2 changes by 10% in accordance with a process change. FIG. 4B shows a simulation result when an inductor L of the passive element A shown in FIG. 2 changes by 10% in accordance with a process change. FIG. 4C shows a simulation result when a capacitor C of the passive element A shown in FIG. 2 changes by 10% in accordance with a process change.

As shown in FIGS. 4A to 4C, when the value of the passive element A changes to some degree in accordance with a process change, the conventional device for generating a chaotic signal may not generate a chaotic signal in the range of 3.1 to 5.15 GHz. Accordingly, a chaotic signal cannot be stably generated, which means that the device is sensitive to a process change.

SUMMARY OF THE INVENTION

An advantage of the present invention is that it provides a device and a method for generating a chaotic signal, in which a digital-type PN signal generator is used to stably generate a chaotic signal regardless of a process change.

Additional aspect and advantages of the present general inventive concept will be set forth in part in the description which follows and, in part, will be obvious from the description, or may be learned by practice of the general inventive concept.

According to an aspect of the invention, a device for generating a chaotic signal comprises a PN signal generator that is composed of a digital logic circuit and generates a digital pseudo random signal with a predetermined frequency; a voltage control that generates a clock signal with a predetermined frequency; a mixer that mixes the pseudo random signal and the clock signal so as to generate a chaotic signal to output; and a band-pass filter that filters the chaotic signal, output from the mixer, into a chaotic signal of a desired band and then outputs the filtered signal.

Preferably, the PN signal generator is composed of a digital logic circuit, including N (N is a positive number) D-flip flops and a gate unit, and generates a predetermined bit number $(2^N-1)$ of pseudo random signals.

Preferably, each of the D-flip flops includes an even number of inverters and switches and, in accordance with an applied sine-wave signal, outputs an input signal without phase inversion.

Preferably, the gate unit receives an output of the (N−1)th D-flip flop and an output of the Nth D-flip flop so as to generate a signal for an input of the first D-flip flop. Further, the gate unit is composed of an X-OR gate.

Preferably, the switches are composed of first and second MOSFETs which are connected to the inverters, the gates of the first and second MOSFETs receive a clock signal and an inverted signal of the clock signal, respectively, a body terminal of the first MOSFET is connected to a power supply, and a body terminal of the second MOSFET is grounded.

Preferably, the first MOSFET is a p-type MOSFET, and the second MOSFET is an n-type MOSFET.

According to another aspect of the invention, a method for generating a chaotic signal comprises (a) generating a digital pseudo random signal with a predetermined frequency; (b) generating a clock signal with a predetermined frequency; (c) mixing the digital pseudo random signal generated at step (a) and the clock signal generated at step (b) so as to generate a chaotic signal to output; and (d) filtering the chaotic signal, output from step (c), into a chaotic signal of a desired band and then outputting the filtered signal.

Preferably, in step (a), N (N is a positive number) D-flip flops and a gate unit are used to generate a predetermined bit number $(2^N-1)$ of pseudo random signals.

Preferably, each of the D-flip flops includes an even number of inverters and switches and, in accordance with an applied sine-wave signal, outputs an input signal without phase inversion.

Preferably, the gate unit receives an output of the (N−1)th D-flip flop and an output of the Nth D-flip flop so as to generate a signal for an input of the first D-flip flop. Further, the gate unit is composed of an X-OR gate.

Preferably, the switches are composed of first and second MOSFETs which are connected to the inverters, the gates of the first and second MOSFETs receive a clock signal and an inverted signal of the clock signal, respectively, a body terminal of the first MOSFET is connected to a power supply, and a body terminal of the second MOSFET is grounded.

Preferably, the first MOSFET is a p-type MOSFET, and the second MOSFET is an n-type MOSFET.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a block diagram showing a basic structure of an OOK modulator using a chaotic signal;

FIG. 2 is a circuit diagram of a conventional device for generating a chaotic signal;

FIG. 3 is a graph showing a simulation result of FIG. 2;

FIGS. 4A to 4C are graph showing simulation results when the value of a passive element shown in FIG. 2 changes in accordance with a process change;

FIG. 5 is a block diagram of a device for generating a chaotic signal according to an embodiment of the invention;

FIG. 6 is a diagram showing the structure of a PN signal generator included in the invention;

FIG. 7A is a diagram showing the structure of a D-flip flop according to this embodiment;

FIG. 7B is a diagram showing the structure of a switch of the D-flip flop;

FIG. 7C is FIG. 7C is a graph showing clock signals in an inverted relation, which are applied to switches;

FIG. 8 is a block diagram of an X-OR gate according to this embodiment;

FIGS. 9A to 9F are graphs showing simulation results of an output voltage waveform and a spectrum which are generated in the invention; and FIG. 10 shows a flow chart of a method for generating a chaotic signal according to an embodiment of the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, a preferred embodiment of the present invention will be described in detail with reference to the accompanying drawings.

FIG. 5 is a block diagram of a device for generating a chaotic signal according to an embodiment of the invention. As shown in FIG. 5, the device for generating a chaotic signal includes a PN signal generator 51, a voltage control oscillator 52, a mixer 53, and a band-pass filter 54.

The PN signal generator 51 composed of a digital logic circuit generates a digital pseudo random signal with a predetermined frequency.

FIG. 6 is a diagram showing the structure of the PN signal generator 51 included in the invention. As shown in FIG. 6, the PN signal generator 51 is composed of a digital logic circuit, including N (N is a positive number) D-flip flops 61 and a gate unit 62, and generates a predetermined bit number $(2^N-1)$ of pseudo random signals by using the N D-flip flops 61 and the gate unit 62.

As described above, the device for generating a chaotic signal uses the digital-logic-type PN signal generator 51 which is not sensitive to a process change. Therefore, the device for generating a chaotic signal can stably generate a chaotic signal regardless of a process change.

In this embodiment, the PN signal generator 51 including 15 D-flip flops is used, and the following descriptions will be focused thereon.

Each of the D-flip flops 61 includes even numbers of inverters and switches. In accordance with an applied sine-wave signal (clock), the D-flip flop outputs an input signal D without phase inversion. In this embodiment, the D-flip flop is composed of two inverters and two switches, and the following descriptions will be focused thereon.

FIG. 7A is a diagram showing the structure of a D-flip flop according to this embodiment. As shown in FIG. 7A, the D-flip flop includes two inverters 71 and two switches 72 which are connected to each other.

Since the D-flip flop of this embodiment uses two inverters 71, the phase of an applied input signal D is not changed. Accordingly, the D-flip flop can deliver the input signal D to an output stage of the inverter 71 without phase inversion.

The operation of the D-flip flop will be described with reference to FIG. 7A. When an input signal D is applied, the inverter 71 at the front stage inverts the signal and maintains the inverted signal. Then, when the two switches 72 are turned on, the inverted signal is delivered to the inverter 71 at the rear stage. At this time, the two switches 72 operate out of phase with each other by applied signals clk and clkb in an inverted relation.

FIG. 7B is a diagram showing the structure of a switch of the D-flip flop. As shown in FIG. 7B, the switch of this embodiment is composed of two active elements 72a and 72b, each of which includes a gate, a source, and a drain.

In the active elements 72a and 72b, the magnitude and direction of a current flowing from the drain to the source or from the source to the drain is determined by the magnitude and polarity of a voltage applied between the gate and the source.

As for the transistors, there are provided a bipolar junction transistor (BJT), a junction gate field-effect transistor (JFET), a metal-oxide-semiconductor field-effect transistor (MOSFET), a metal-semiconductor field-effect transistor (MESFET) and the like.

A certain active element further includes a body terminal in addition to a gate, a source, and a drain. The magnitude, amount and direction of a current flowing from the drain to the source or from the source to the drain are determined by the magnitude and polarity of a voltage applied between the gate and the body terminal. As for the active element, there are provided a metal-oxide-semiconductor field-effect transistor (MOSFET) and the like.

The following descriptions will be focused on the MOSFET However, the invention can be applied to all the active elements having the above-described characteristic as well as the MOSFET Therefore, although the descriptions of the invention are focused on the MOSFET, the scope of the invention is not limited to the MOSFET.

As described above, the switches of this embodiment are composed of first and second MOSFETs 72a and 72b, of which the gates receive a clock signal clk and an inverted signal clkb of the clock signal clk, respectively. To stably operate the first and second MOSFETs 72a and 72b, the body terminal of the first MOSFETs 72a is connected to a power supply VDD, and the body terminal of the second MOSFET 72b is grounded.

In this embodiment, a p-type MOSFET is used as the first MOSFET 72a, and an n-type MOSFET is used as the second MOSFET 72b. However, this is only for convenience of description. The invention is not limited to a specific combination of MOSFETs, but other type MOSFETs or another combination of MOSFETs can be used so as to perform substantially the same operation.

FIG. 7C is a graph showing clock signals in an inverted relation, which are applied to the switches. As shown in FIG. 7C, it can be found that two signals clk and clkb applied to the switches have a phase difference of 180 degrees. When a clock signal is low (0V), the second MOSFET 72b as an n-type MOSFET is turned off. When a click signal is high (1.8V), the second MOSFET 72b is turned on to deliver a signal, applied to an input stage IN, to an output stage OUT.

Meanwhile, the gate unit 62 of FIG. 6 receives an output of the 14th D-flip flop and an output of the 15th D-flip flop so as to generate a signal D for an input of the first D-flip flop. In this embodiment, the gate unit 62 is composed of an X-OR gate.

FIG. 8 is a block diagram of an X-OR gate according to this embodiment. The X-OR gate includes four NAND gates and a NOT gates implemented of a buffer. The truth table of the X-OR gate is based on Table 1.

TABLE 1

| A | B | A XOR B (C) |
|---|---|---|
| 0 | 0 | 1 |
| 0 | 1 | 0 |
| 1 | 0 | 0 |
| 1 | 1 | 1 |

The voltage control oscillator 52 of FIG. 5 generates a clock signal with a predetermined frequency so as to shift the frequency of a pseudo random signal generated from the PN signal generator 51 of FIG. 5. The mixer 53 of FIG. 5 mixes the pseudo random signal generated from the PN signal generator 51 and the clock signal so as to generate a chaotic signal to output.

Further, the band-pass filter 54 of FIG. 5 filters the chaotic signal, output from the mixer 53, into a chaotic signal of a desired band to output. Since this embodiment is mainly applied to a communication system using the UWB, the band-pass filter 54 filters the chaotic signal into a chaotic signal with a frequency of 3 to 5 GHz.

FIGS. 9A to 9F are graphs showing simulation results of an output voltage waveform and a spectrum which are generated in the invention. The simulation is performed so that the frequency of a pseudo random signal generated from the PN signal generator 51 of FIG. 5 corresponds to 1 GHz and the frequency of a clock signal generated from the voltage control oscillator 52 of FIG. 5 corresponds to 4 GHz.

FIGS. 9A and 9B show an output voltage waveform and a frequency spectrum in the D-flip flop. As shown in FIG. 9A, it can be found that the voltage waveform generated from the D-flip flop is an irregular waveform in which 0 (voltage of 0V) and 1 (voltage of 1.8V) are mixed in accordance with time. Further, as shown in FIG. 9B, it can be found that the frequency spectrum is distributed to a range of 1 GHz.

Through such simulation results, it can be found that each of the D-flip flops generates random data.

FIGS. 9C and 9D show an output voltage waveform and a frequency spectrum in the X-OR gate. It can be found that the X-OR gate also generates random data like the above-described D-flip flop. The data is applied as an input of the mixer 5 of FIG. 5.

FIG. 9E shows the frequency spectrum of a clock signal generated from the voltage control oscillator of FIG. 5. It can be found that the voltage control oscillator generates a local oscillation frequency of 4 GHz.

FIG. 9F shows the frequency spectrum of a chaotic signal which is finally generated in the invention. As shown in FIG. 9F, it can be found that a chaotic signal in the range of 3 to 5 GHz is generated which is required in the UWB communication system.

Meanwhile, FIG. 10 shows a flow chart of a method for generating a chaotic signal according to an embodiment of the invention. As shown in FIG. 10, the method for generating a chaotic signal is roughly divided into four steps.

First, a digital pseudo random signal with a predetermined frequency is generated (S101).

Next, a clock signal with a predetermined frequency is generated (S102).

Then, the pseudo random signal generated at step S101 and the clock signal generated at step S102 are mixed to generate a chaotic signal to output (S103).

Finally, the chaotic signal generated at step S103 is filtered into a chaotic signal of a desired band (3 to 5 GHz) and is then output (S104).

According to the device and the method for generating a chaotic signal, as the digital-type PN signal generator is used, a chaotic signal can be stably generated regardless of a process change.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A device to generate a chaotic signal, comprising:
    a PN signal generator comprising a digital logic circuit and generating a digital pseudo random signal with a predetermined frequency;
    a voltage control that generates a clock signal with a predetermined frequency;
    a mixer that mixes the pseudo random signal and the clock signal so as to generate a chaotic signal to output; and
    a band-pass filter that filters the chaotic signal, output from the mixer, into a chaotic signal of a desired band and then outputs the filtered signal,
    the PN signal generator comprising a digital logic circuit, including N (N being a positive number) D-flip flops and a gate unit, and generating a predetermined bit number ($2^N-1$) of pseudo random signals, and
    each of the D-flip flops including an even number of inverters and switches and, in accordance with an applied sine-wave signal, outputting an input signal without phase inversion.

2. The device according to claim 1,
    wherein the gate unit receives an output of the (N−1)th D-flip flop and an output of the Nth D-flip flop so as to generate a signal for an input of the first D-flip flop.

3. The device according to claim 1,
    wherein the switches comprise first and second MOSFETs which are connected to the inverters, the gates of the first and second MOSFETs receive a clock signal and an inverted signal of the clock signal, respectively, a body terminal of the first MOSFET is connected to a power supply, and a body terminal of the second MOSFET is grounded.

4. The device according to claim 3,
    wherein the first MOSFET is a p-type MOSFET, and the second MOSFET is an n-type MOSFET.

5. The device according to claim 2,
    wherein the gate unit comprises an X-OR gate.

6. A method of generating a chaotic signal, comprising:
    generating a digital pseudo random signal with a predetermined frequency;
    generating a clock signal with a predetermined frequency;
    mixing the generated digital pseudo random signal and the generated clock signal to generate a chaotic signal;
    outputting the generated chaotic signal; and
    filtering the output chaotic signal into a chaotic signal of a desired band and then outputting the filtered signal,
    the generating the digital pseudo random signal comprising using N (N being a positive number) D-flip flops and a gate unit to generate a predetermined bit number ($2^N-1$) of pseudo random signals, and
    each of the D-flip flops including an even number of inverters and switches and, in accordance with an applied sine-wave signal, outputting an input signal without phase inversion.

7. The method according to claim 6, further comprising receiving, at the gate unit, an output of the (N−1)th D-flip flop and an output of the Nth D-flip flop so as to generate a signal for an input of the first D-flip flop.

8. The method according to claim 6, wherein the switches comprise first and second MOSFETs and the method further comprises:
    connecting the first and second MOSFETs to the inverters,
    receiving, at the gates of the first and second MOSFETs, a clock signal and an inverted signal of the clock signal, respectively,
    connecting a body terminal of the first MOSFET to a power supply, and
    grounding a body terminal of the second MOSFET.

9. The method according to claim 6,
    wherein the first MOSFET is a p-type MOSFET, and the second MOSFET is an n-type MOSFET.

10. The method according to claim 6,
    wherein the gate unit comprises an X-OR gate.

* * * * *